(12) United States Patent
Kiani

(10) Patent No.: US 6,724,595 B1
(45) Date of Patent: Apr. 20, 2004

(54) OUTPUT DRIVER WITH OVER VOLTAGE PROTECTION

(75) Inventor: Khusrow Kiani, Oakland, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 400 days.

(21) Appl. No.: 09/790,913

(22) Filed: Feb. 22, 2001

Related U.S. Application Data
(60) Provisional application No. 60/184,253, filed on Feb. 23, 2000.

(51) Int. Cl.[7] .................................................. H02H 3/20
(52) U.S. Cl. ......................................... 361/91.1; 361/86
(58) Field of Search ........................ 361/86–93; 326/27, 326/58, 81, 87

(56) References Cited

U.S. PATENT DOCUMENTS

| | | | |
|---|---|---|---|
| 5,399,917 A | 3/1995 | Allen et al. ................. 327/436 |
| 5,434,531 A | 7/1995 | Allen et al. ................. 327/530 |
| 5,455,732 A * | 10/1995 | Davis .......................... 361/90 |
| 5,543,733 A | 8/1996 | Mattos et al. ................ 326/81 |
| 5,574,389 A | 11/1996 | Chu .............................. 326/81 |
| 5,576,655 A | 11/1996 | Fujihira et al. ............. 327/537 |
| 5,646,809 A | 7/1997 | Motley et al. ................ 361/56 |
| 5,719,525 A | 2/1998 | Khoury ....................... 327/562 |
| 6,081,412 A * | 6/2000 | Duncan et al. ............... 361/86 |
| 6,437,958 B1 * | 8/2002 | Duncan et al. ............. 361/91.1 |

* cited by examiner

Primary Examiner—Gregory J. Toatley, Jr.
Assistant Examiner—Boris Benenson
(74) Attorney, Agent, or Firm—Mark C. Pickering

(57) ABSTRACT

An output driver obtains over voltage protection by utilizing a first transistor to pass signals from an internal node to an external node when the driver is transmitting data, and to isolate the internal node from the external node when the driver has stopped transmitting data. When the driver has stopped transmitting data, the voltage on the external node is subject to rising. The output driver also utilizes a second transistor and a resistance to ground to control the first transistor.

18 Claims, 5 Drawing Sheets

US 6,724,595 B1

OUTPUT DRIVER WITH OVER VOLTAGE PROTECTION

This application claims priority from provisional application No. 60/184,253 filed Feb. 23, 2000 by Khusrow Kiani for Voltage Tolerant Input Buffer for 0.25 Micron-Process Circuit.

BACKGROUND OF THE INVENTION

1. Field of the Invention

The present invention relates to output drivers and, more particularly, to an output driver with over voltage protection.

2. Description of the Related Art

An output driver is a circuit that sources a substantial current to, or sinks a substantial current from, a capacitive external circuit to drive an output signal onto the external circuit. In addition, output drivers are commonly utilized to provide an interface between a low-voltage digital circuit, such as a circuit that outputs a logic high as a 1.5V signal, and a high-voltage external circuit, such as a circuit that inputs a logic high as a 3.3V signal.

FIG. 1 shows a schematic diagram that illustrates a simple prior-art output driver 100. As shown in FIG. 1, driver 100 includes a PMOS transistor 110 and a NMOS transistor 112. PMOS transistor 110 has a gate, a source connected to an I/O power-supply voltage VDDIO, such as 3.3V, and a drain connected to an external node EXT.

The source and drain of PMOS transistor 110 are formed in an n-type material, such as a well or substrate, which is connected to the I/O power-supply voltage VDDIO. In addition, a channel region is defined between the source arid drain in the n-type material, and a layer of gate oxide is formed over the channel region to isolate the gate from the channel region.

NMOS transistor 112 has a gate, a source connected to ground, and a drain connected to the external node EXT. The source and drain of NMOS transistor 112 are formed in a p-type material, such as a well or substrate, which is connected to ground. In addition, a channel region is defined between the source and drain in the p-type material, and a layer of gate oxide is formed over the channel region to isolate the gate from the channel region.

In operation, when a logic low is output from a digital circuit, the voltage on the gate of PMOS transistor 110 turns off PMOS transistor 110, while the voltage on the gate of NMOS transistor 112 turns on NMOS transistor 112. When NMOS transistor 112 turns on, transistor 112 sinks current from the external node EXT, thereby pulling the voltage on the external node EXT down to ground.

On the other hand, when a logic high is output from the digital circuit, the voltage on the gate of PMOS transistor 110 turns on PMOS transistor 110, while the voltage on the gate of NMOS transistor 112 turns off NMOS transistor 112. When PMOS transistor 110 turns on, transistor 110 sources current to the external node EXT, thereby pulling up the voltage on the external node EXT to the I/O power supply voltage VDDIO, e.g., 3.3V.

One problem with driver 100 is that driver 100 lacks over voltage protection, and thus can not be connected to an external circuit, such as a PCI bus, that carries voltages that are substantially higher than the I/O power supply voltage VDDIO. One reason for this is that if driver 100 were connected to such a circuit, the higher voltages would destroy the oxide layer of transistor 112.

For example, assume that the external node EXT of driver 100 is connected to a PCI bus that experiences a maximum voltage of 5.5V. Further assume that driver 100 is turned off by placing the I/O power supply voltage VDDIO on the gate of PMOS transistor 110, and ground on the gate of NMOS transistor 112. Additionally assume that the I/O power supply voltage VDDIO is equal to 3.3V.

With 3.3V MOS transistors, destructive oxide breakdown typically occurs when the voltage dropped across the layer of gate oxide exceeds approximately 4.2V. In the present example, with ground on the gate of transistor 112 and 5.5V on the drain of transistor 112, 5.5V are dropped across the layer of gate oxide. Since a value of 5.5V is well above the destructive breakdown level of 4.2V, the higher voltage destroys the gate oxide layer.

Another reason that driver 100 can not be connected to an external circuit that sees higher voltages is that transistor 112 sinks a current at these voltages due to punch through. The higher voltage on the drain of transistor 112 increases the drain depletion region to the point where the source and drain depletion regions overlap. This condition, known as punch through, allows current to flow from the drain to the source region.

With 3.3V MOS transistors, punch through typically occurs when the drain-to-source voltage exceeds, approximately 3.7V. In the present example, with ground on the source of transistor 112 and 5.5V on the drain of transistor 112, the drain-to-source voltage is equal to 5.5V. Since a value of 5.5V is well above the punch through level of 3.7V, the higher voltage causes a current to flow.

A further reason that driver 100 can not be connected to an external circuit that sees higher voltages is that transistor 110 turns on at these voltages and injects current into the I/O power supply voltage VDDIO. The higher voltage on the drain of transistor 110 causes the drain to temporarily become the source of transistor 110. As is well known, a PMOS transistor turns on when the gate-to-source voltage is less than the threshold voltage of the transistor, and the source-to-drain voltage is greater than the bias voltage of the transistor.

With 3.3V PMOS transistors, a threshold voltage of −0.7V and a bias voltage of +0.2V are common. In the present example, with 3.3V on the source (temporarily functioning as the drain) and gate of transistor 112, and 5.5V on the drain (temporarily functioning as the source) of transistor 112, the gate-to-source voltage is equal to −2.2V (3.3−5.5), while the source-to-drain voltage is equal to +2.2V (5.5−3.3). Since a value of −2.2V is well below the threshold voltage of −0.7V and a value of +2.2V is well above the bias voltage of +0.2V, PMOS transistor 110 turns on.

In addition to turning on, PMOS transistor 110 also has a forward-biased junction to the well/substrate of transistor 110 that produces a large current flow. As is well known, the source-to-well/substrate junction of a PMOS transistor is forward biased when the voltage on the p+ source region is greater than the voltage on the n-type well/substrate by more than the junction voltage of the transistor. With 3.3V MOS transistors, a junction voltage of +0.7V is common.

In the present example, with 3.3V on the well/substrate of transistor 110 and 5.5V on the drain (temporarily functioning as the source) of transistor 110, the junction voltage is equal to +2.2V (5.5−3.3). Since a value of +2.2V is well above the junction voltage of +0.7V, a large current flows across the junction.

FIG. 2 shows a schematic diagram that illustrates a prior-art output driver 200 that includes over voltage protection circuitry. As a result, output driver 200 can be connected to an external circuit, such as a PCI bus, that carries voltages that are substantially higher than the I/O power supply voltage VDDIO.

As shown in FIG. 2, driver 200 includes a PMOS transistor 210, a NMOS transistor 212, and a NMOS transistor 214. PMOS transistor 210 has a gate, a source connected to an I/O power-supply voltage VDDIO, such as 3.3V, and a drain connected to an external node EXT. In addition, the source and drain of transistor 210 are formed in an n-well.

NMOS transistor 212 has a gate connected to the I/O power-supply voltage VDDIO, a source, and a drain connected to the external node EXT. In addition, the source and drain of transistor 212 are formed in a p-type material that is connected to ground. NMOS transistor 214 has a gate, a source connected to ground, and a drain connected to the source of transistor 212. In addition, the source and drain of transistor 214 are formed in the p-type material that is connected to ground.

Driver 200 also includes a PMOS transistor 220, a PMOS transistor 222, and a PMOS transistor 224. PMOS transistor 220 has a gate, a source connected to the I/O power-supply voltage VDDIO, and a drain connected to the n-well. In addition, the source and drain of transistor 220 are formed in the n-well.

PMOS transistor 222 has a gate connected to the I/O power-supply voltage VDDIO, a source connected to the drain of transistor 220, and a drain connected to the external node EXT. In addition, the source and drain of transistor 222 are formed in the n-well. PMOS transistor 224 has a gate connected to the I/O power-supply voltage VDDIO, a source connected to the drain of transistor 220, and a drain connected to the gate of transistor 210. In addition, the source and drain of transistor 224 are formed in the n-well.

Driver 200 further includes a PMOS transistor 230 and an NMOS transistor 232. PMOS transistor 230 has a gate connected to the I/O power-supply voltage VDDIO, a source connected to the external node EXT, and a drain connected to the gate of transistor 220. In addition, the source and drain of transistor 230 are formed in an n-type material that is connected to the external node EXT. NMOS transistor 232 has a gate connected to the I/O power supply-voltage VDDIO, a drain connected to the external node EXT, and a source connected to the gate of transistor 220. In addition, the source and drain of transistor 232 are formed in a p-type material that is connected to ground.

Driver 200 further includes a PMOS transistor 240 and an NMOS transistor 242. PMOS transistor 240 has a gate connected to the gate of transistor 220, a source connected to the gate of transistor 210, and a drain. In addition, the source and drain of transistor 240 are formed in an n-type material that is connected to the gate of transistor 210. NMOS transistor 242 has a gate connected to the I/O power-supply voltage VDDIO, a source connected to the drain of transistor 240, and a drain connected to the gate of transistor 210. In addition, the source and drain of transistor 242 are formed in a p-type material that is connected to ground.

In operation, transistor 212 is always turned on since the gate of transistor 212 is connected to the I/O power-supply voltage VDDIO. In addition, when driver 200 outputs data, such as to a PCI bus, transistor 242 is always turned on. As a result, when the signal output from a digital circuit is a logic low, the voltage on the gate of PMOS transistor 210 turns off PMOS transistor 210, while the voltage on the gate of NMOS transistor 214 turns on NMOS transistor 214. When NMOS transistor 214 turns on, transistor 214 sinks current from the external node EXT, thereby pulling the voltage on the external node EXT down to ground.

On the other hand, when the signal output from the digital circuit is a logic high, the voltage on the gate of PMOS transistor 210 turns on PMOS transistor 210, while the voltage on the gate of NMOS transistor 212 turns off NMOS transistor 212. When PMOS transistor 210 turns on, transistor 210 sources current to the external node EXT, thereby pulling up the voltage on the external node EXT to the I/O power supply voltage VDDIO, e.g., 3.3V.

When driver 200 is not outputting data and the voltage on the external node EXT rises to a voltage greater than the I/O power-supply voltage VDDIO, such as to 5.5V, transistor 212 protects transistor 214 from both destructive oxide breakdown and punch through.

Since the gate of transistor 212 is connected to the I/O power supply voltage VDDIO, the voltage on the source of transistor 212 and the drain of transistor 214 is limited to the I/O power supply voltage VDDIO less the threshold voltage VTH of transistor 212. Thus, with an I/O power supply voltage VDDIO equal to 3.3V and a threshold voltage equal to +0.7V, the voltage on the drain of transistor 214 is limited to approximately +2.6V which is less than the destructive oxide breakdown level of 4.2V and the punch through level of 3.7V. As a result, transistor 214 is protected from the over voltage condition.

In addition, when the voltage on the external node EXT rises to 5.5V, transistor 210 is protected from turning on and from forward biasing the junction. When 5.5V are on the external node EXT, transistor 222 turns on. When transistor 222 turns on, the n-well charges up to the voltage on the external node EXT, e.g., 5.5V.

As a result, the voltage on the drain (functioning as the source) of transistor 210 and the voltage on the n-well of transistor 210 are both equal to 5.5V. Thus, the voltage across the junction is equal to zero which, in turn, is less than the junction voltage of 0.7V, thereby insuring that the junction is not forward biased.

Further, since the source of transistor 224 is connected to the n-well and the gate of transistor 224 is connected to the I/O power supply voltage VDDIO, transistor 224 turns on when the voltage on the n-well rises to 5.5V. As a result, the voltage on the gate of transistor 210 rises to approximately 5.5V. Since 5.5V are now on both the gate and drain (functioning as the source) of transistor 210, transistor 210 remains off.

Thus, since transistors 210 and 214 are both protected from an over voltage condition, driver 200 can be connected to an external circuit, such as a PCI bus, that carries voltages that are substantially higher than the I/O power supply voltage VDDIO.

In addition, transistors 230 and 232 pass the voltage on the external node EXT to the gates of transistor 220 and 240. Thus, when 5.5V are on the external node EXT, transistor 220 turns off. Further, since 5.5V is on both the gate and source of transistor 240, transistor 240 is also turned off.

Additionally, the voltage on the source of transistor 242 is limited to a threshold voltage drop less than the I/O power supply voltage VDDIO. As a result, transistors 240 and 242 protect the circuits that drive transistor 210 when 5.5V are on the external node EXT. When driver 200 again outputs data, transistor 220 turns on and returns the voltage on the n-well to the I/O power supply voltage VDDIO.

FIG. 3 shows a schematic diagram that illustrates another prior-art output driver 300 that includes over voltage protection circuitry. As shown in FIG. 3, driver 300 includes a PMOS transistor 310, a NMOS transistor 312, and a NMOS transistor 314. PMOS transistor 310 has a gate, a source connected to an I/O power-supply voltage VDDIO, such as 3.3V, and a drain connected to an external node EXT. In addition, the source and drain of transistor 310 are formed in an n-well 316.

NMOS transistor 312 has a gate connected to the I/O power-supply voltage VDDIO, a source, and a drain connected to the external node EXT. In addition, the source and drain of transistor 312 are formed in a p-type material that is connected to ground. NMOS transistor 314 has a gate, a source connected to ground, and a drain connected to the source of transistor 312. In addition, the source and drain of transistor 314 are formed in the p-type material that is connected to ground.

Driver 300 also includes a PMOS transistor 320, a PMOS transistor 322, and a resistive element R1. PMOS transistor 320 has a gate, a source connected to the I/O power-supply voltage VDDIO, and a drain. In addition, the source and drain of transistor 320 are formed in n-well 316.

PMOS transistor 322 has a gate connected to the I/O power-supply voltage VDDIO, a drain connected to the gate of transistor 320, and a source connected to the drain of transistor 320. In addition, the source and drain of transistor 322 are formed in n-well 316. Resistive element R1, which can be implemented with a number of NMOS transistors in series, is connected between the gate of transistor 320 and ground.

Driver 300 further includes a PMOS transistor 330, a PMOS transistor 332 and a resistor R2. PMOS transistor 330 has a gate connected to the I/O power-supply voltage VDDIO, a source connected to the drain of transistor 320, and a drain connected to the gate of transistor 310. In addition, the source and drain of transistor 330 are formed in n-well 316. PMOS transistor 332 has a gate connected to the I/O power-supply voltage VDDIO, a source connected to the drain of transistor 320, and a drain connected to n-well 316. In addition, the source and drain of transistor 332 are formed in n-well 316. Resistor R2, in turn, is connected between the sources of transistors 330 and 332 and the external node EXT.

Driver 300 further includes a PMOS transistor 334, a PMOS transistor 336 and a NMOS transistor 338. PMOS transistor 334 has a gate, a source connected to the I/O power-supply voltage VDDIO, and a drain connected to n-well 316. In addition, the source and drain of transistor 334 are formed in n-well 316.

PMOS transistor 336 has a gate connected to the I/O power-supply voltage VDDIO, a source connected to the drain of transistor 320, and a drain connected to the gate of transistor 334. In addition, the source and drain of transistor 336 are formed in n-well 316. NMOS transistor 338 has a gate connected to the I/O power-supply voltage VDDIO, a drain connected to the drain of transistor 320, and a source connected to the gate of transistor 334. In addition, the source and drain of transistor 338 are formed in a p-type material connected to ground.

Driver 300 further includes a PMOS transistor 340 and an NMOS transistor 342. PMOS transistor 340 has a gate connected to the gate of transistor 320, a source connected to the gate of transistor 310, and a drain. In addition, the source and drain of transistor 340 are formed in an n-type material that is connected to the gate of transistor 310. NMOS transistor 342 has a gate connected to the I/O power-supply voltage VDDIO, a source connected to the drain of transistor 340, and a drain connected to the gate of transistor 310. In addition, the source and drain of transistor 342 are formed in a p-type material that is connected to ground.

In operation, transistor 312 is always turned on since the gate of transistor 312 is connected to the I/O power-supply voltage VDDIO. In addition, when driver 300 outputs data, transistor 342 is always turned on. As a result, when the signal output from a digital circuit is a logic low, the voltage on the gate of PMOS transistor 310 turns off PMOS transistor 310, while the voltage on the gate of NMOS transistor 314 turns on NMOS transistor 314. When NMOS transistor 314 turns on, transistor 314 sinks current from the external node EXT, thereby pulling the voltage on the external node EXT down to ground.

On the other hand, when the signal output from the digital circuit is a logic high, the voltage on the gate of PMOS transistor 310 turns on PMOS transistor 310, while the voltage on the gate of NMOS transistor 312 turns off NMOS transistor 312. When PMOS transistor 310 turns on, transistor 310 sources current to the external node EXT, thereby pulling up the voltage on the external node EXT to the I/O power supply voltage VDDIO, e.g., 3.3V.

When driver 300 is not outputting data and the voltage on the external node EXT rises to a voltage greater than the I/O power-supply voltage VDDIO, such as to 5.5V, transistor 312 protects transistor 314 from both destructive oxide breakdown and punch through in the same manner that transistor 212 protects transistor 214.

In addition, when the voltage on the external node EXT rises to 5.5V, transistor 310 is protected from turning on and from forward biasing the junction. Resistor R2 passes the voltage on the external node EXT to the sources of transistors 322, 330, 332, and 336, and the drains of transistors 320 and 338.

The 5.5V passed to the sources of transistors 330 and 332 turn on these transistors. When transistor 330 turns on, the 5.5V on the source are passed to the gate of transistor 310. Since 5.5V is now on the gate and drain (functioning as the source) of transistor 310, transistor 310 remains off.

When transistor 332 turns on, n-well 316 charges up to 5.5V. As a result, the voltage on the drain (functioning as the source) of transistor 310 and the voltage on n-well 316 of transistor 310 are both equal to 5.5V. Thus, the voltage across the junction is equal to zero which, in turn, is less than the junction voltage of 0.7V, thereby insuring that the junction is not forward biased.

In addition, when the voltage on the external node EXT rises to 5.5V, transistor 322 turns on. When transistor 322 turns on, the 5.5V are passed to the gates of transistors 320 and 340, thereby turning off these transistors. Further, the 5.5V on the sources of transistors 330 and 332 turn on transistor 336 which, in turn, turns off transistors 334 and 338.

When driver 300 again outputs data, transistor 322 turns off. When transistor 322 turns off, the voltage on the gate of transistor 320 is pulled low via resistive element R1, thereby turning on transistor 320. As a result, the I/O power-supply voltage VDDIO is placed on the source of transistor 336, which turns off transistor 336, and on the drain of transistor 338.

Transistor 338 then turns on which, in turn, places the I/O power-supply voltage VDDIO on the gate of transistor 334. Since 5.5V is initially on n-well 316, transistors 332 and 334 turn on until the voltage on n-well 316 has fallen to approximately the I/O power supply voltage VDDIO.

Although output drivers 200 and 300 provide over voltage protection, there is a need for alternate circuits for providing over voltage protection.

SUMMARY OF THE INVENTION

The present invention provides an output driver with an over voltage protection circuit that is connected between an internal node and an external node. The over voltage protection circuit includes a pass/isolation element that is connected to the internal and external nodes. The pass/isolation element has a first control node. The pass/isolation element passes a voltage on the internal node to the external node when a signal on the first control node is in a first logic state. The pass/isolation element isolates the internal node from the external node when the signal on the first control node is in a second logic state.

The over voltage protection circuit also includes a first control element that is connected to the external node, the first control node, a ground node, and a power supply node. The control element places the signal in the first logic state when a voltage on the external node is less than the sum of a supply voltage on the power supply node and a predefined voltage. The control element places the signal in the second logic state when a voltage on the external node is greater than the sum of the supply voltage and the predefined voltage.

The over voltage protection circuit can also include a voltage-setting element that is connected to the internal node and the power supply node. The voltage-setting element has a second control node. The voltage-setting element passes the supply voltage to the internal node when a signal on the second control node of the voltage-setting element is in a first logic state. The voltage-setting element isolates the supply voltage from the internal node when the signal on the second control node is in a second logic state.

The over voltage protection circuit can further include a second control element that is connected to the first control node, the second control node, a ground node, and the power supply node. The second control element places the signal on the second control node in the first logic state when a voltage on the external node is greater than the sum of the supply voltage and a predefined voltage. The second control element places the signal on the second control node in the second state when a voltage on the external node is less than the sum of the supply voltage and the predefined voltage.

The over voltage protection circuit can alternately include a voltage-setting element that is connected to the internal node, the external node, and the power supply node. The voltage-setting element sources a current to the internal node.

The driver of the present invention can also include a first driver element that is connected to the internal node. The first driver element has a third control node, and sources current to the internal node when a signal on the third control node is in a first logic state, and turns off when the signal on the third control node is in a second logic state.

The driver of the present invention can further include a second driver element that is connected to the internal node. The second driver element has a fourth control node, and sinks current from the internal node when a signal on the fourth control node is in a second logic state, and turns off when the signal on the second control node is in a first logic state.

A better understanding of the features and advantages of the present invention will be obtained by reference to the following detailed description and accompanying drawings which set forth an illustrative embodiment in which the principles of the invention are utilized.

DETAILED DESCRIPTION

Figures 1, 2:
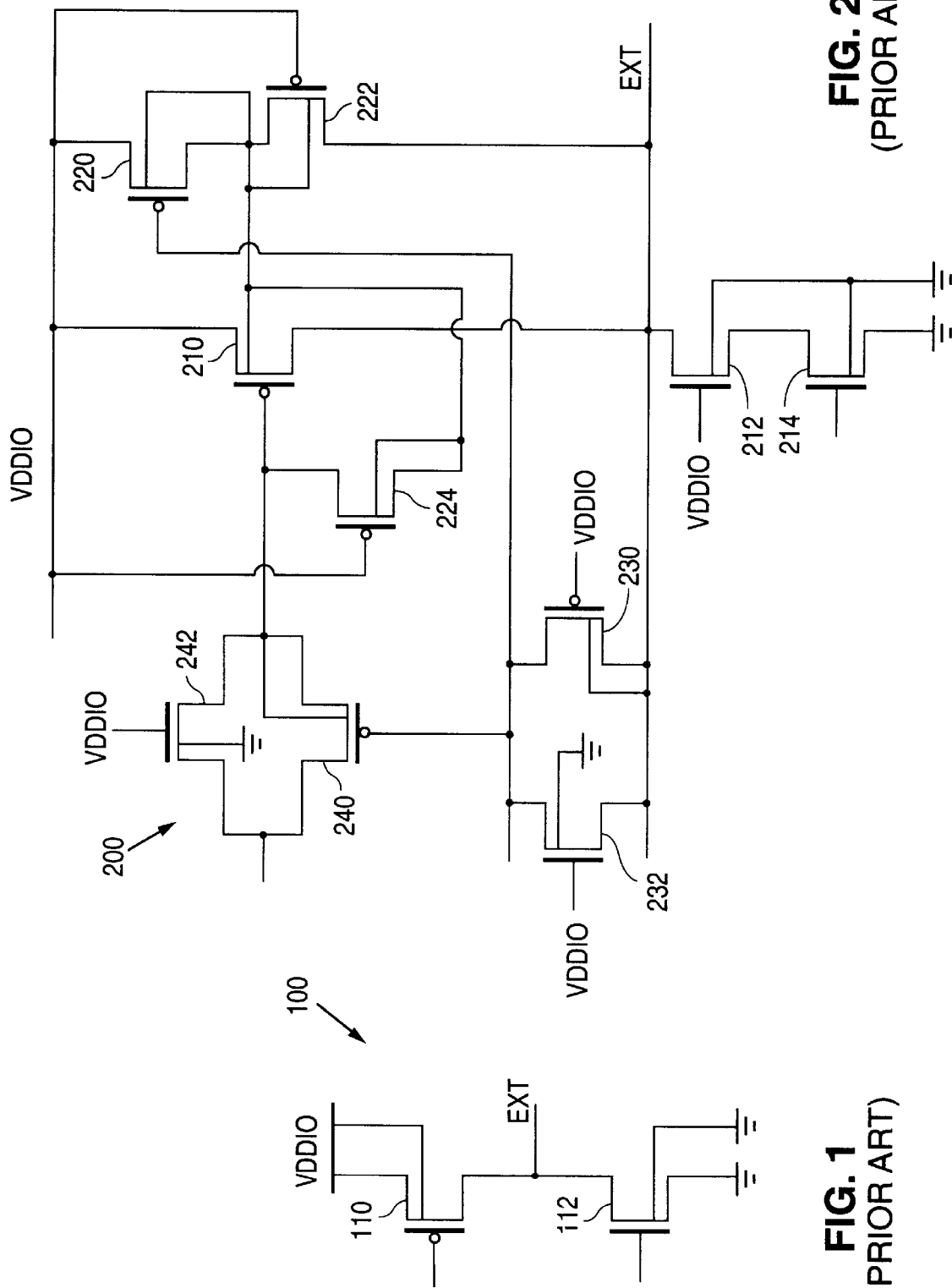
FIG. 1 is a schematic diagram illustrating a simple prior-art output driver 100.
FIG. 2 is a schematic diagram illustrating a prior-art output driver 200 that includes over voltage protection circuitry.
Figure 3:
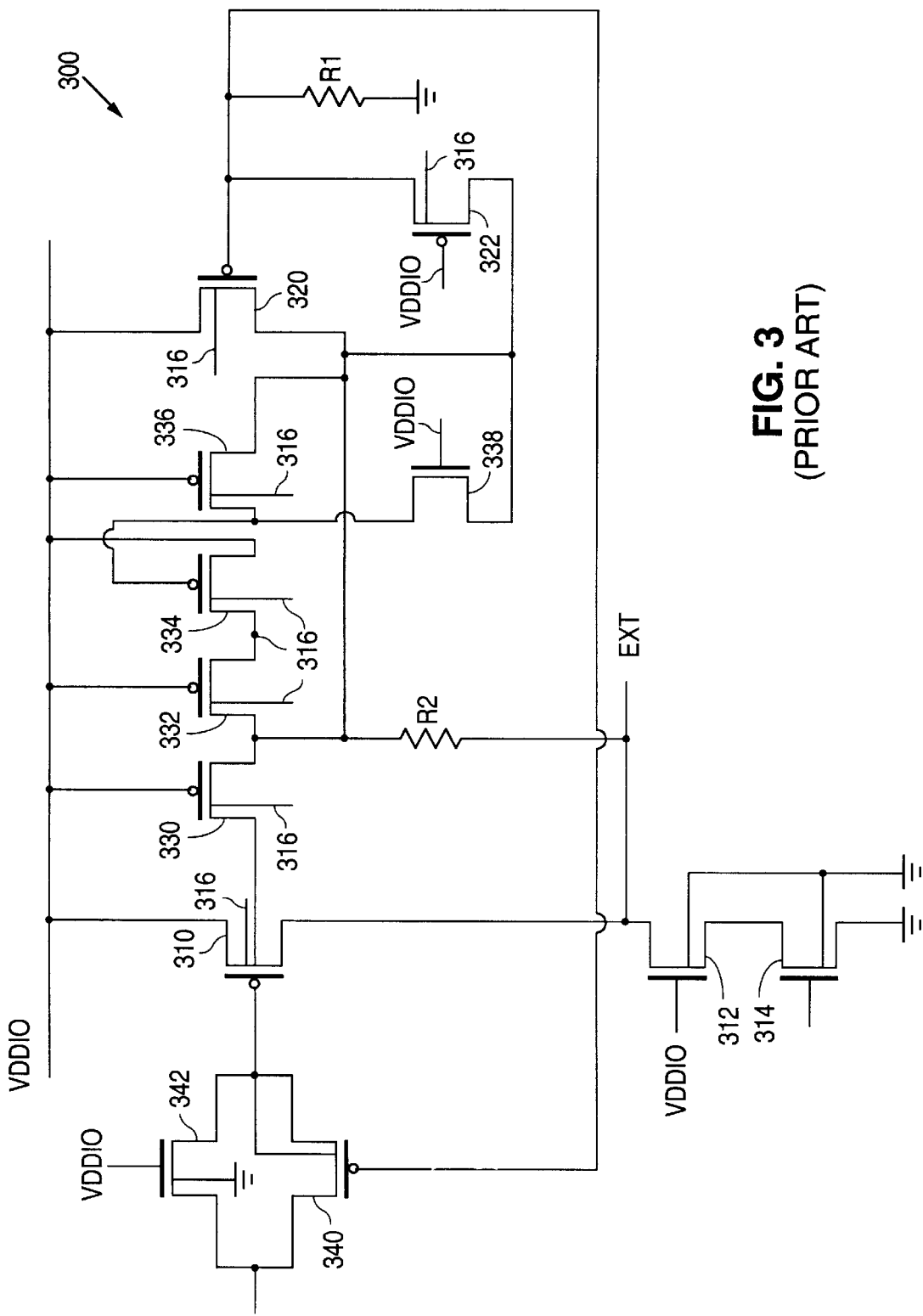
FIG. 3 is a schematic diagram illustrating a prior-art output driver 300 that includes over voltage protection circuitry.

The present invention provides an output driver with over voltage protection. As described in greater detail below, the output driver includes p-channel and n-channel driver transistors that transmit data signals to an external pad when the driver is in a normal mode of operation, such as when the driver has control of a PCI bus. In addition, the output driver isolates the drains of the p-channel and n-channel driver transistors from the voltages on the external pad when the driver is in a stress mode of operation, such as when the driver has surrendered control of the PCI bus.

In addition to isolating the drains of the p-channel and n-channel driver transistors, the output driver of the present invention also places a predefined voltage on the drains of the p-channel and n-channel driver transistors during the stress mode of operation. The predefined voltage is selected to eliminate the problems of prior-art driver 100, and preferably is equal to an I/O power supply voltage, e.g., 3.3V +/−10%.

In addition to placing the predefined voltage on the drain of the p-channel driver transistor, the output driver also places a voltage on each remaining terminal of the p-channel driver transistor that insures that the p-channel driver transistor is turned off. In addition, this also insures that the p-channel driver transistor has no forward-biased junctions to the well/substrate of the p-channel driver transistor.

In addition to placing the predefined voltage on the drain of the n-channel driver transistor, the output driver also places ground on each remaining terminal of the n-channel driver transistor. The predefined voltage is selected so that, under worst case conditions, the predefined voltage is less than the punch through voltage of the n-channel driver transistor (which is less than the destructive oxide breakdown voltage of the transistor).

For example, an I/O power supply that provides 3.3V +/−10% has a maximum voltage of 3.63V (3.3+0.33). A maximum voltage of 3.63V, in turn, is less than a 4.2V destructive oxide breakdown voltage and a 3.7V punch through voltage. Thus, the output driver protects the n-channel driver transistor from destructive oxide breakdown and punch through.

One of the major advantages of the output driver of the present invention is that the driver is independent of the core supply voltage of the chip and, as a result, can be utilized with different core supply voltages. This versatility allows one output driver to be used with a variety of core circuits.

For example, the output driver can utilize 0.35-micron "thick-gate" transistors that utilize a 3.3V +/−10% I/O power while the core utilizes 0.25-micron, 0.18-micron, or 0.15-micron "thin-gate" transistors that utilize 2.5V, 1.8V, or 1.5V core supply voltages, respectively.

Figure 4:
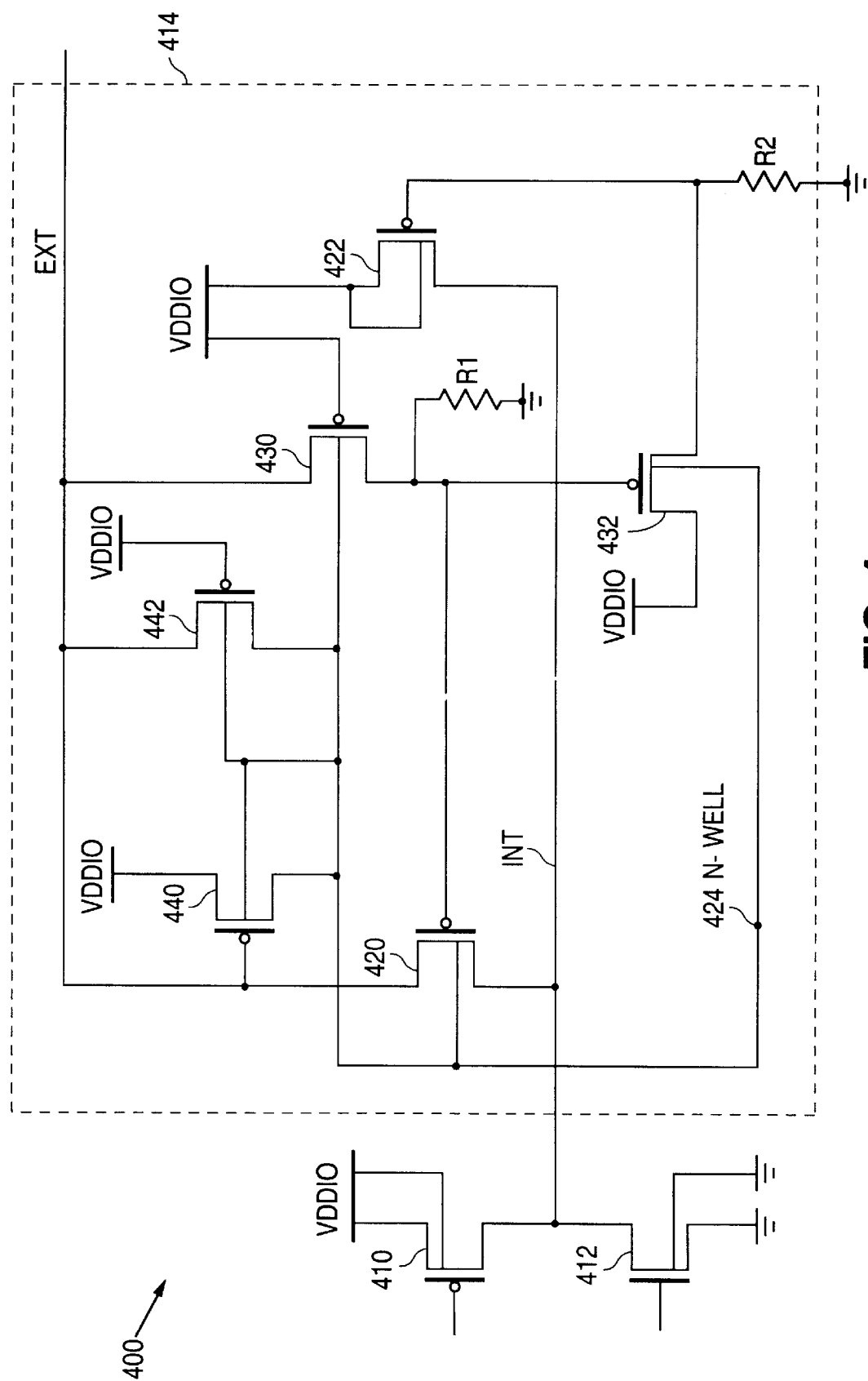
FIG. 4 is a schematic diagram illustrating an output driver 400 with over voltage protection in accordance with the present invention.

FIG. 4 shows a schematic diagram that illustrates an output driver 400 with over voltage protection in accordance with the present invention. As shown in FIG. 4, driver 400 includes a PMOS transistor 410, a NMOS transistor 412, and an over voltage protection circuit 414. PMOS transistor 410 has a gate, a source connected to an I/O power-supply voltage VDDIO, such as 3.3V +/−10%, and a drain connected to an internal node INT.

The source and drain of PMOS transistor 410 are formed in an n-type material, such as a well or substrate, which is connected to the I/O power-supply voltage VDDIO. In addition, a channel region is defined between the source and drain in the n-type material, and a layer of gate oxide is formed over the channel region to isolate the gate from the channel region.

NMOS transistor 412 has a gate, a source connected to ground, and a drain connected to the internal node INT. The source and drain of NMOS transistor 412 are formed in a p-type material, such as a well or substrate, which is connected to ground. In addition, a channel region is defined between the source and drain in the p-type material, and a layer of gate oxide is formed over the channel region to isolate the gate from the channel region.

As further shown in FIG. 4, over voltage protection circuit 414 includes a PMOS transistor 420 and a PMOS transistor 422. Transistor 420 has a gate, a source connected to an external node EXT, and a drain connected to the internal node INT. The source and drain of transistor 420 are formed in an n-well 424 that floats (is not hard wired to a power supply or an external pad).

Transistor 422 has a gate, a source connected to the I/O power-supply voltage VDDIO, and a drain connected to the internal node INT. The source and drain of transistor 422 are formed in an n-type material that is connected to the I/O power-supply voltage VDDIO.

As further shown in FIG. 4, circuit 414 also includes a PMOS transistor 430 and a PMOS transistor 432. Transistor 430 has a gate connected to the I/O power-supply voltage VDDIO, a source connected to the external node EXT, and a drain connected to the gate of transistor 420. The source and drain of transistor 430 are formed in floating n-well 424.

Transistor 432 has a gate connected to the gate of transistor 420, a source connected to the I/O power-supply voltage VDDIO, and a drain connected to the gate of transistor 422. The source and drain of transistor 432 are formed in floating n-well 424.

Circuit 414 further includes a pair of PMOS well-control transistors 440 and 442. Transistor 440 has a gate connected to the external node EXT, a source connected to the I/O power-supply voltage VDDIO, and a drain connected to n-well 424. The source and drain of transistor 440 are formed in floating n-well 424.

Transistor 442 has a gate connected to the I/O power-supply voltage VDDIO, a source connected to the external node EXT, and a drain connected to n-well 424. The source and drain of transistor 442 are formed in floating n-well 424.

Circuit 414 additionally includes a first resistive element R1 and a second resistive element R2. Resistive element R1 is formed between the gate of transistor 420 and ground, and can be implemented with a number of NMOS transistors in series. In a two-transistor example, the first NMOS transistor (not shown) has a gate connected to the I/O power-supply voltage VDDIO, a source, and a drain connected to the gate of transistor 420.

The second NMOS transistor (not shown) has a gate, a source connected to ground, and a drain connected to the source of the first NMOS transistor. The first NMOS transistor protects the second NMOS transistor from a high voltage, such as 5.5V in a manner similar to transistor 212, while the second NMOS transistor is biased to operate in the linear region, thereby providing a resistance of, for example, 1000KΩ. Resistive element R2 is formed between the gate of transistor 422 and ground, and can be implemented with a number of NMOS transistors in series in the same way that resistive element R1 is implemented.

Driver 400 has two modes of operation: a normal mode and a stress mode. In the normal mode of operation, such as when driver 400 has control of a PCI bus, driver 400 transmits data signals to the external node EXT. When the data signal is a logic high, the voltage on the gate of PMOS transistor 410 turns off transistor 410. At the same time, the voltage on the gate of NMOS transistor 412 turns on transistor 412. When NMOS transistor 412 turns on, transistor 412 sinks current from the internal node INT, thereby pulling the voltage on the internal node INT down to ground.

Within over voltage protection circuit 414, transistor 430 is turned off when driver 400 transmits data signals. As described in greater detail below, when driver 400 transmits data signals, the external node EXT is driven to the I/O power-supply voltage VDDIO when a logic high is transmitted. Since the gate of transistor 430 is also connected to the I/O power-supply voltage VDDIO, transistor 430 is turned off when driver 400 transmits data signals.

When transistor 430 is turned off, the voltage on the gate of transistor 420 is pulled to ground via resistive element R1, thereby turning on transistor 420. As a result, transistor 412 sinks current from the external node EXT via the internal node INT. When the voltage on the internal node INT reaches the threshold voltage of transistor 420 (approximately 0.7V worse case), transistor 420 turns off. Thus, although transistor 412 pulls down the voltage on the internal node INT to ground, the voltage on the external node EXT can only be pulled down to the threshold voltage of transistor 420 (approximately 0.7V worse case).

When the voltage on the gate of transistor 420 is pulled down to ground, the voltage on the gate of transistor 432 is also pulled down to ground, thereby turning on transistor 432. When transistor 432 turns on, the I/O power-supply voltage VDDIO is passed to the gate of transistor 422, thereby turning off transistor 422.

On the other hand, when the data signal is a logic low, the voltage on the gate of PMOS transistor 410 turns on PMOS transistor 410, while the voltage on the gate of NMOS transistor 412 turns off NMOS transistor 412. When PMOS transistor 410 turns on, transistor 410 sources current to the internal node INT, thereby pulling up the voltage on the internal node INT to the I/O power supply voltage VDDIO, e.g., 3.3V +/−10%.

Within over voltage protection circuit 414, transistor 430 remains turned off, transistor 420 remains turned on, transistor 432 remains turned on, and transistor 422 remains turned off when a logic high is transmitted. As a result, transistor 420 sources current to the external node EXT via the internal node INT, thereby pulling up the voltage on the external node EXT to the I/O power supply voltage VDDIO.

In the stress mode of operation, such as when the driver has surrendered control of the PCI bus and no longer transmits data signals, driver 400 isolates the drains of the p-channel and n-channel driver transistors 410 and 412 from the external voltage on the external node EXT.

When the voltage on the external node EXT rises to an external voltage, such as to 5.5V, that is greater than the sum of the I/O power-supply voltage VDDIO and the threshold voltage, circuit 414 prevents transistor 410 from turning on and having a forward-biased junction to the well/substrate. (5.5V is the worst case condition for a 5V +/−10% power supply.) Circuit 414 also protects transistor 412 from experiencing both destructive oxide breakdown and punch through.

When the voltage on the external node EXT exceeds the sum of the I/O power-supply voltage VDDIO and the threshold voltage VTH of transistor 430, such as when an external voltage of 5.5V is present on the external node EXT, transistor 430 turns on. When transistor 430 turns on, the external voltage is passed to the gates of transistors 420 and 432, thereby turning off transistors 420 and 432.

When transistor 420 turns off, the internal node INT is isolated from the external node EXT. When transistor 432 turns off, the voltage on the gate of transistor 422 is pulled to ground via resistive element R2, thereby turning on transistor 422. When transistor 422 turns on, the I/O power-supply voltage VDDIO on the source of transistor 422 is passed to the internal node INT. Thus, the maximum voltage seen by the drains of transistors 410 and 412 is an I/O power-supply voltage VDDIO of 3.63V (the worst case condition for a 3.3V +/−10% power supply).

When driver 400 has stopped transmitting data signals, the I/O power-supply voltage VDDIO is placed on the gate of transistor 410. As described above, the I/O power supply voltage is also placed on the source, and the well/substrate of transistor 410. As a result, the I/O power-supply voltage VDDIO is placed on each terminal of transistor 410. Under these conditions, transistor 410 can not turn on or have a forward-biased junction to the well/substrate of transistor 410.

In addition, if transistor 412 has a destructive oxide breakdown level of 4.2V and a punch through level of 3.7V, which are typical for a 3.3V transistor, then a maximum I/O power-supply voltage VDDIO of 3.63V is less than both of these levels. As a result, transistor 412 is protected from both destructive oxide breakdown and punch through.

Further, the voltage placed on the internal node INT by transistor 422 during the stress mode of operation is also sufficient to prevent transistor 420 from experiencing punch through. In this case, all of the terminals of transistor 420, except the terminal connected to the internal node INT, are connected to the external voltage on the external node EXT.

As a result, the source-to-drain voltage of transistor 420 is less than the punch through voltage. For example, using 5.5V and 3.63V as the worse case conditions, the source-to-drain voltage of transistor 420 is equal to 1.87V (5.50−3.63), a value well less than the 3.7V punch through level common with 3.3V transistors.

Well-control transistors 440 and 442 insure that floating n-well 424 is charged to the highest potential currently on the external node EXT. Thus, transistors 440 and 442 place the I/O power-supply voltage VDDIO on floating n-well 424 when driver 400 is in the normal mode and transmitting data signals, and the voltage on the external node EXT on floating n-well 424 when driver 400 is in the stress mode and not transmitting data signals.

In operation, when the voltage on the external node EXT is equal to or less than the I/O power-supply voltage VDDIO plus the threshold voltage of transistor 440 (transistors 440 and 442 have substantially the same threshold voltage), transistor 440 turns on while transistor 442 turns off.

When transistor 440 turns on, transistor 440 charges floating n-well 424 to a value approximately equal to the I/O power-supply voltage VDDIO. Thus, when the voltage on the external node EXT rises from 0V to a value that is equal to or less than the I/O power-supply voltage VDDIO plus the threshold voltage, the voltage on floating n-well 424 is approximately equal to the I/O power-supply voltage VDDIO.

When the voltage on the external node is greater than the sum of the I/O power-supply voltage VDDIO and the threshold voltage of transistor 440, transistor 440 turns off and transistor 442 turns on. When transistor 442 turns on, transistor 442 charges floating n-well 424 to a value approximately equal to the voltage on the external node EXT. As a result, when the voltage on the external node EXT rises to 5.5V, the voltage on floating n-well 424 rises to 5.5V.

Thus, in accordance with the present invention, output driver 400 provides over voltage protection to the drains of transistors 410 and 412. This, in turn, allows driver 400 to be connected to an external environment, such as a PCI bus, that has voltages that are well above the I/O power-supply voltage VDDIO.

Figure 5:
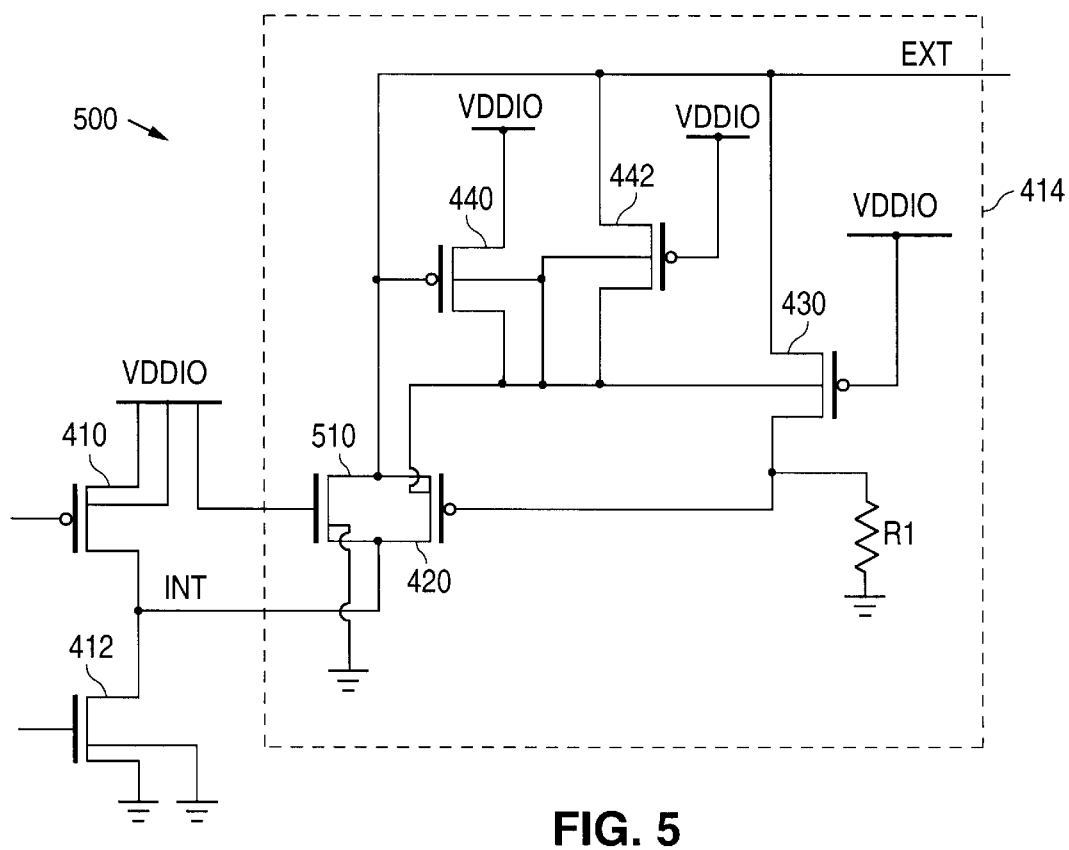
FIG. 5 is a schematic diagram illustrating an output driver 500 with over voltage protection in accordance with an alternate embodiment of the present invention.

FIG. 5 shows a schematic diagram that illustrates an output driver 500 with over voltage protection in accordance with an alternate embodiment of the present invention. Driver 500 is similar to driver 400 and, as a result, utilizes the same reference numerals to designate the structures that are common to both drivers.

As shown in FIG. 5, driver 500 differs from driver 400 in that over voltage protection circuit 414 of driver 500 has an NMOS transistor 510, and does not utilize transistor 422, transistor 432, and resistive element R2. Transistor 510 has a gate connected to the I/O power-supply voltage VDDIO, a source connected to the internal node INT, and a drain connected to the external node EXT. The source and drain of transistor 510 are formed in a p-type material that is connected to a ground node.

Driver 500 also has a normal mode of operation and a stress mode of operation. In the normal mode of operation, such as when driver 500 has control of a PCI bus, driver 500 transmits data signals to the external node EXT. When the data signal is a logic high, the voltage on the gate of PMOS transistor 410 turns off transistor 410. At the same time, the voltage on the gate of NMOS transistor 412 turns on transistor 412. When NMOS transistor 412 turns on, transistor 412 sinks current from the internal node INT, thereby pulling the voltage on the internal node INT down to ground.

Within over voltage protection circuit 414, transistor 430 is turned off when driver 500 transmits data signals. When transistor 430 is turned off, the voltage on the gate of transistor 420 is pulled to ground via resistive element R1, thereby turning on transistor 420. As a result, transistor 412 sinks current from the external node EXT via the internal node INT.

As with driver 400, when the voltage on the internal node INT of driver 500 reaches the threshold voltage of transistor 420 (0.7V), transistor 420 turns off. However, unlike driver 400, driver 500 also includes transistor 510 which is always turned on. As a result, transistor 412 is able to pull the voltage on the external node EXT down to ground via transistor 510. Thus, one of the advantages of driver 500 over driver 400 is that driver 500 transmits data signals that swing rail to rail.

On the other hand, when the data signal is a logic low, the voltage on the gate of PMOS transistor 410 turns on PMOS transistor 410, while the voltage on the gate of NMOS transistor 412 turns off NMOS transistor 412. When PMOS transistor 410 turns on, transistor 410 sources current to the internal node INT, thereby pulling up the voltage on the internal node INT to the I/O power supply voltage VDDIO, e.g., 3.3V +/−10%.

Within over voltage protection circuit 414, transistor 510 remains turned on, transistor 430 remains turned off, and transistor 420 remains turned on when a logic high is transmitted. As a result, transistor 410 sources current to the external node EXT via the internal node INT, thereby pulling up the voltage on the external node EXT to the I/O power supply voltage VDDIO.

In addition to a normal mode of operation, driver 500 also has a stress mode of operation, such as when the driver has surrendered control of the PCI bus and is no longer transmitting. In the stress mode of operation, driver 500 isolates the drains of the p-channel and n-channel driver transistors 410 and 412 from the external voltage on the external node EXT.

When the voltage on the external node EXT rises to an external voltage, such as to 5.5V, that is greater than the sum of the I/O power-supply voltage VDDIO and the threshold voltage, circuit 414 prevents transistor 410 from turning on and having a forward-biased junction to the well/substrate of transistor 410. (5.5V is the worst case condition for a 5V+/−10% power supply.) Circuit 414 also protects transistor 412 from experiencing both destructive oxide breakdown and punch through.

When the voltage on the external node EXT exceeds the sum of the I/O power-supply voltage VDDIO and the threshold voltage VTH of transistor 430, such as when an external voltage of 5.5V is present on the external node EXT, transistor 430 turns on. When transistor 430 turns on, the external voltage is passed to the gate of transistor 420, thereby turning off transistor 420. When transistor 420 turns off, transistor 420 and transistor 510 isolate the internal node INT from the external node EXT.

Since the gate of transistor 510 is connected to the I/O power supply voltage VDDIO, the maximum voltage on the internal node INT is limited to the I/O power supply voltage VDDIO less the threshold voltage of transistor 510. Thus, the maximum voltage seen by the drains of transistors 410 and 412 is 2.93V, an I/O power-supply voltage VDDIO of 3.63V (the worst-case maximum condition for a 3.3V +/−10% power supply) less 0.7V (the worst-case threshold voltage). In addition, the minimum voltage seen by the drains of transistors 410 and 412 is 2.27V (based on an I/O power-supply voltage VDDIO of 2.97V (the worst-case minimum condition for a 3.3V +/−10% power supply) less a 0.7V threshold voltage).

As with driver 400, when driver 500 is in the stress mode and has stopped transmitting data signals, the I/O power-supply voltage VDDIO is placed on the gate of transistor 410. In addition, as with driver 400, the I/O power supply voltage VDDIO is also placed on the source and the well/substrate of transistor 410.

Thus, in the worst-case maximum condition, 3.63V is on the gate, source, and well/substrate of transistor 410, while 2.93V is on the drain of transistor 410. To turn on or have a forward-biased junction to the well/substrate, the voltage on the drain of transistor 410 must be at least a threshold voltage greater than the I/O power supply voltage of 3.63V. Since this is not the case, transistor 410 is turned off. In addition, transistor 410 has no forward-biased junction to the well/substrate of transistor 410.

In the worst-case minimum condition, 2.97V are on the gate, source, and well/substrate of transistor 410, while 2.27V are on the drain of transistor 410. To turn on or have a forward-biased junction to the well/substrate, the voltage on the drain of transistor 410 must be at least a threshold voltage greater than the I/O power supply voltage of 2.97V. Since this is not the case, transistor 410 is turned off. In addition, transistor 410 has no forward-biased junction to the well/substrate of transistor 410.

In addition, if transistor 412 has a destructive oxide breakdown level of 4.2V and a punch through level of 3.7V, which are typical for a 3.3V transistor, then a worst-case maximum I/O power-supply voltage VDDIO of 2.97V is less than both of these levels. In addition, a worst-case minimum I/O power supply voltage of 2.27V is also less than both of these levels. As a result, transistor 412 of driver 500 is protected from both destructive oxide breakdown and punch through.

The voltage placed on the internal node INT during the stress mode of operation by transistor 510 is also sufficient to prevent transistor 420 from experiencing punch through. In the worse-case maximum condition of the stress mode, transistor 420 has an external voltage, such as 5.5V (worse-case for 5V +/−10%), on the gate, the source, and the well, while the drain sees 2.93V. Thus, the source-to-drain voltage of transistor 420 is 2.57V (5.5−2.93) which is less than the 3.7 punch through voltage commonly required for a 3.3V MOS transistor.

In the worse-case minimum condition of the stress mode, transistor 420 has an external voltage, such as 4.5V (worse-case for 5V +/−10%), on the gate, the source, and the well, while the drain sees 2.27V. Thus, the source-to-drain voltage of transistor 420 is 2.23V (4.5−2.27)which is less than a 3.7 punch through voltage.

Figure 6:
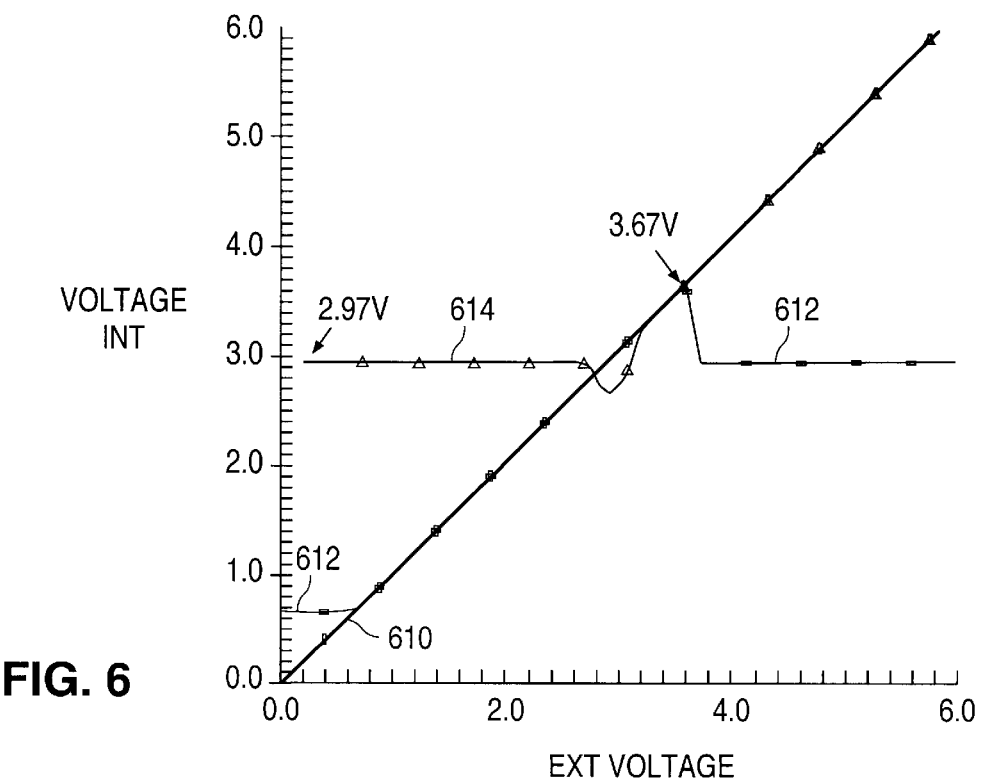
FIG. 6 is a graph illustrating the voltage on the external node EXT vs. the voltage on the internal node INT as a result of a simulation of circuit 400 in accordance with the present invention.

FIG. 6 is a graph that illustrates the voltage on the external node EXT vs. the voltage on the internal node INT as a result of a simulation of circuit 400 in accordance with the present invention. In the simulation, the voltage on the external node EXT is provided by a voltage source connected between the external node EXT and ground. In addition, the simulation includes a capacitance connected between the external node EXT and ground. The capacitance represents the pad capacitance of the external node EXT (e.g. 10 pF). The simulation also utilizes an I/O power-supply voltage VDDIO of 2.97V (the worse-case minimum voltage of 3.3V+/−10%), a threshold voltage of 0.7V, and a junction temperature of 125° C.

As shown in FIG. 6, the voltage source outputs a voltage 610 (marked with a vertical rectangle) on the external node EXT. As voltage 610 increases, a voltage 612 (marked with a horizontal rectangle) on internal node INT tracks voltage 610 (once voltage 610 exceeds approximately 0.68V) until voltage 610 exceeds approximately 3.67V (the I/O power-supply voltage VDDIO of 2.97V plus the threshold voltage of 0.7V). At this point, transistor 430 turns on, transistor 420 turns off, transistor 432 turns off, and transistor 422 turns on. As a result, voltage 612 falls back to the I/O power-supply voltage VDDIO of 2.97V.

FIG. 6 also illustrates the voltage on the external node EXT vs. the voltage on n-well 424 in accordance with the present invention. As shown in FIG. 6, when voltage 610 equals 0V, a voltage 614 (marked with a triangle) on n-well 424 is equal to 2.97V, the I/O power-supply voltage VDDIO. When voltage 610 nears the I/O power-supply voltage VDDIO of 2.97V, voltage 614 falls slightly, and then tracks voltage 610 as voltage 610 rises above 3.67V (the I/O power-supply voltage VDDIO of 2.97V plus the threshold voltage of 0.7V).

Figure 7:
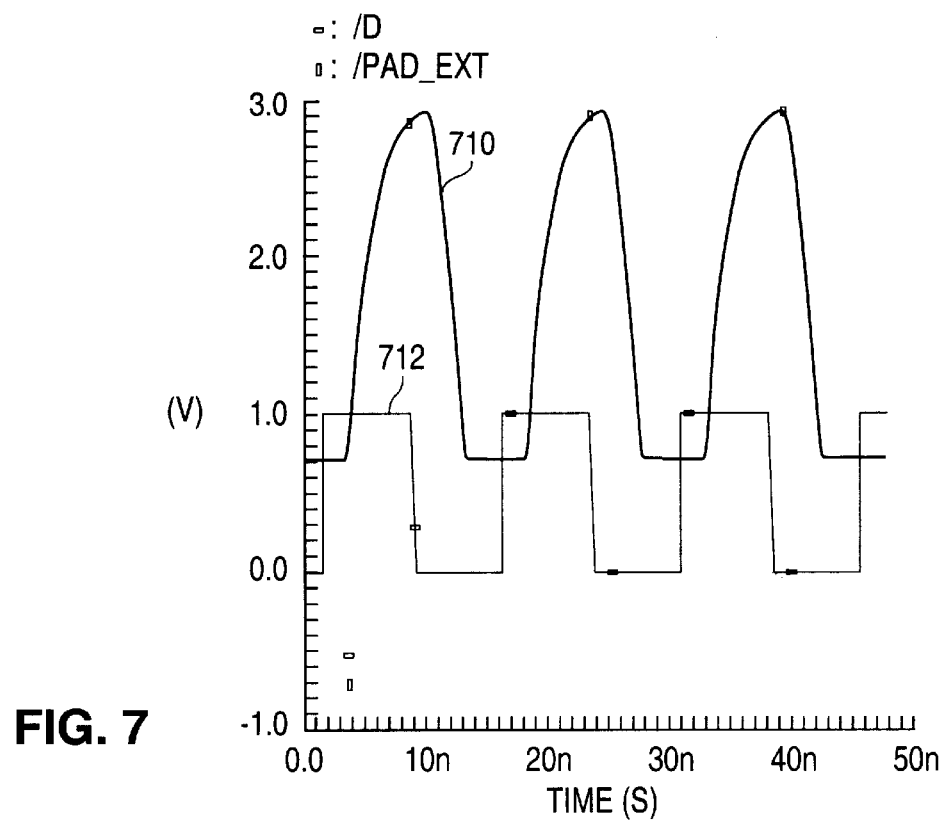
FIG. 7 is a graph illustrating a voltage signal on the external node EXT of driver 400 in response to a data signal in accordance with the present invention.

FIG. 7 is a graph that illustrates a voltage signal 710 on the external node EXT of driver 400 in response to a data signal 712 in accordance with the present invention. In the simulation, the data signal 712 (marked with a horizontal rectangle), which has yet to be level shifted by a predriver that feeds output driver 400, swings between zero and one volt. In addition, the simulation also included a pad capacitance connected between the external node EXT and ground of about 15 pF. The simulation also utilizes an I/O power-supply voltage VDDIO of 3.0 volts, a threshold voltage of 0.65V, and a temperature of 125° C. The simulation further utilizes a 133 MHz signal that has a 15 nS period, a rise time of 500 pS, a fall time of 500 pS, and a pulse width of 7 nS.

As shown in FIG. 7, during the normal mode of operation, the voltage signal 710 on the external node EXT (marked with a vertical rectangle) swings between the upper rail of 3.0V and a lower value of approximately 0.7V. As a result, driver 400 is unable to hit the lower rail of 0V.

As noted above, when driver 400 transmits a logic high data signal, transistor 410 sources current into the internal node INT, thereby pulling up the voltage on the internal node INT. Transistor 420 of driver 400 then turns on and passes the I/O power supply voltage VDDIO to the external node EXT.

When driver 400 transitions from a logic high to a logic low, the voltage on the internal node INT is pulled down by transistor 412. However, when the voltage on the internal node INT reaches the threshold voltage of transistor 420 (approximately 0.7V worse case), transistor 420 turns off. Thus, although transistor 412 pulls down the voltage on the internal node INT to ground, the voltage on the external node EXT is limited to 0.7V because transistor 420 turned off. As a result, the voltage signal 710 on the external node EXT can not hit the lower rail, but is limited to the threshold voltage (0.7V) of transistor 420.

This is typically not a problem as 3.3V output drivers are commonly specified to represent a logic high with a voltage (VOH) that is equal to or greater than 2.4V, and a logic low with a voltage (VOL) that is equal to or less than 0.8V. Since driver 400 represents a logic high with 3.0V and a logic low with 0.7V, driver 400 satisfies both of these conditions.

Figure 8:
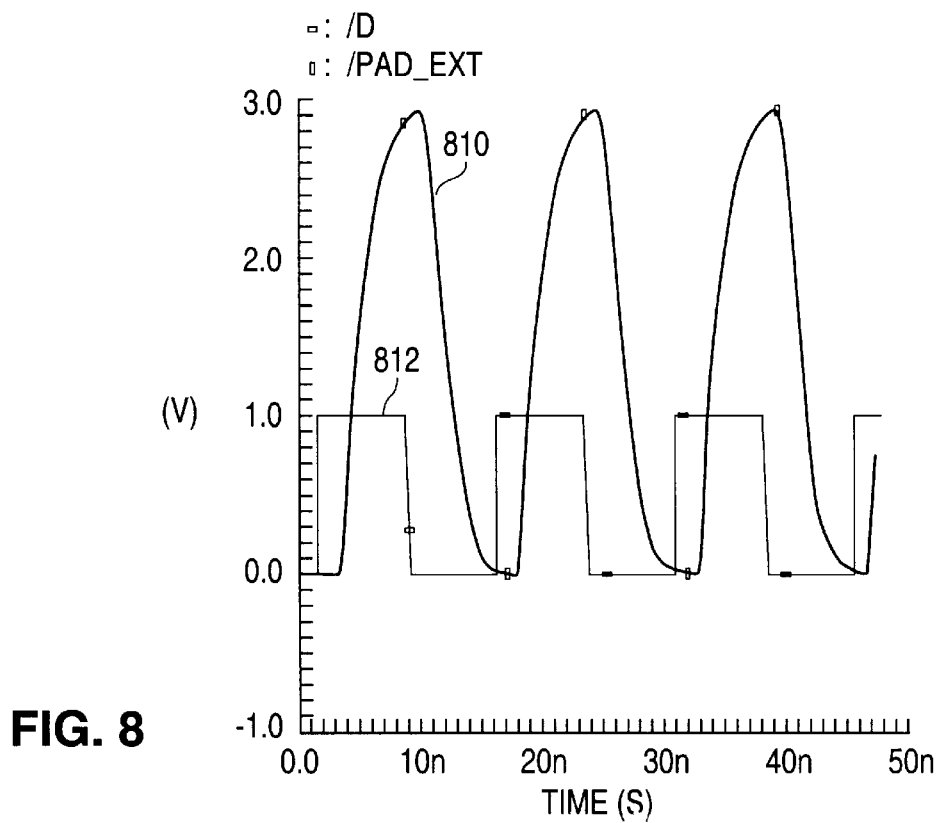
FIG. 8 is a graph illustrating a voltage signal on the external node EXT of driver 500 in response to a data signal in accordance with the present invention.

FIG. 8 is a graph that illustrates a voltage signal 810 on the external node EXT of driver 500 in response to a data signal 812 in accordance with the present invention. In the simulation, the data signal 812 (represented by a horizontal rectangle), which has yet to be level shifted by a predriver that feeds output driver 500, swings between zero and one volt. In addition, the simulation also included a pad capacitance connected between the external node EXT and ground of about 15 pF. The simulation also utilizes an I/O power-supply voltage VDDIO of 3.0 volts, a threshold voltage of 0.65V, and a temperature of 125° C. The simulation further utilizes a 133 MHz signal that has a 15 nS period, a rise time of 500 pS, a fall time of 500 pS, and a pulse width of 7 nS.

As shown in FIG. 8, during the normal mode of operation, the voltage signal 810 (marked with a vertical rectangle) on the external node EXT swings between the upper rail of 3.0V and the lower rail of 0V. As a result, driver 500 is able to swing rail to rail.

As with driver 400, when driver 500 transmits a logic high data signal, transistor 410 sources current into the internal node INT, thereby pulling up the voltage on the internal node INT. Transistor 420 of driver 500 then turns on and passes the I/O power supply voltage VDDIO to the external node EXT.

In addition, when driver 500 transitions from a logic high to a logic low, the voltage on the internal node INT is pulled down by transistor 412. When the voltage on the internal node INT reaches the threshold voltage of transistor 420 (approximately 0.7V worse case), transistor 420 turns off.

With driver 500, however, transistor 510 is always on. As a result, transistor 412 is able to pull the voltage signal 810 on the external node EXT down to the lower rail via transistor 510. Thus, driver 500 allows the external node EXT to swing rail to rail. (Transistor 510 can not be used alone (without transistors 420 and 430 and resistive element R1) because the maximum voltage on the internal node INT would be limited to the I/O power supply voltage VDDIO on the gate of transistor 510 less the threshold voltage of transistor 510. Under worse-case minimum conditions, a 3.3V+/−10% I/O power supply voltage is equal to 2.97V. Subtracting a threshold voltage of 0.7V leaves 2.27V which is less than the 2.4V minimum for VOH.)

It should be understood that various alternatives to the embodiment of the invention described herein may be employed in practicing the invention. Thus, it is intended that the following claims define the scope of the invention and that methods and structures within the scope of these claims and their equivalents be covered thereby.

What is claimed is:

1. An output driver connectable to an external node, the output driver comprising:
    an over voltage protection circuit connected to an internal node and the external node, the over voltage protection circuit including:
        a first transistor having a gate, a source connected to the external node, and a drain connected to the internal node, the source and the drain being formed in a well;
        a second transistor having a gate connected to a supply voltage node, a source connected to the external node, and a drain connected to the gate of the first transistor, the source and the drain of the second transistor being formed in the well;
        a resistive element connected between the gate of the first transistor and a ground node;
        a third transistor having a gate connected to the external node, a source connected to the supply voltage node, and a drain connected to the well, the source and the drain of the third transistor being formed in the well; and
        a fourth transistor having a gate connected to the supply voltage node, a source connected to the external node, and a drain connected to the well, the source and the drain of the fourth transistor being formed in the well.

2. The driver of claim 1 wherein the over voltage protection circuit further includes:
    a fifth transistor having a gate connected to the gate of the first transistor, a source connected to the supply voltage node, and a drain;
    a sixth transistor having a gate connected to the drain of the fifth transistor, a source connected to the supply voltage node, and a drain connected to the internal node; and a resistive element connected between the gate of the sixth transistor and a ground node.

3. The driver of claim 2 wherein the driver further includes:
   a seventh transistor having a gate, a source connected to the supply voltage node, and a drain connected to the internal node; and
   an eighth transistor having a gate, a source connected to a ground node, and a drain connected to the internal node.

4. The driver of claim 1 wherein the over voltage protection circuit further includes a fifth transistor having a gate connected to the supply voltage node, a source connected to the internal node, and a drain connected to the external node.

5. The driver of claim 4 wherein the driver further includes:
   a sixth transistor having a gate, a source connected to the supply voltage node, and a drain connected to the internal node; and
   a seventh transistor having a gate, a source connected to a ground node, and a drain connected to the internal node.

6. An output driver connectable to an external node, the output driver comprising:
   an over voltage protection circuit connected to an internal node and the external node, the over voltage protection circuit including:
      a pass/isolation element connected to the external node, and the internal node, the pass/isolation element having a first control node, the pass/isolation element passing a voltage on the internal node to the external node when a signal on the first control node is in a first logic state, the pass/isolation element isolating the internal node from the external node when the signal on the first control node is in a second logic state;
      a first control element connected to the external node, the first control node, a ground node, and a supply voltage node, the control element placing the signal in the first logic state when a voltage on the external node is less than a supply voltage in combination with a predefined voltage, the control element placing the signal in the second logic state when a voltage on the external node is greater than the supply voltage in combination with the predefined voltage.

7. The driver of claim 6 wherein the over voltage protection circuit further includes:
   a voltage-setting element connected to the internal node and the supply voltage node, the voltage-setting element having a second control node, the voltage-setting element passing the supply voltage when a signal on the second control node of the voltage-setting element is in a first logic state, the voltage-setting element isolating the supply voltage from the internal node when the signal on the second control node is in a second state; and
   a second control element connected to the first control node, the second control node, a ground node, and the supply voltage node, the second control element placing the signal on the second control node in the first logic state when a voltage on the external node is greater than the supply voltage in combination with a predefined voltage, the second control element placing the signal on the second control node in the second logic state when a voltage on the external node is less than the supply voltage in combination with the predefined voltage.

8. The driver of claim 7 wherein the driver further includes:
   a first driver element connected to the internal node, the first driver element having a third control node, and sourcing current to the internal node when a signal on the third control node is in a first logic state, and turning off the first driver element when the signal on the third control node is in a second logic state; and
   a second driver element connected to the internal node, the second driver element having a fourth control node, and sinking current from the internal node when a signal on the fourth control node is in a second logic state, and turning off the second driver element when the signal on the second control node is in a first logic state.

9. An output driver connectable to an external node, the output driver comprising:
   an over voltage protection circuit connected to an internal node and the external node, the over voltage protection circuit including:
      a pass/isolation element connected to the external node, and the internal node, the pass/isolation element having a first control node, the pass/isolation element passing a voltage on the internal node to the external node when a signal on the first control node is in a first logic state, the pass/isolation element isolating the internal node from the external node when the signal on the first control node is in a second logic state, the pass element including a first transistor having a gate, a source connected to the external node, and a drain connected to the internal node, the source and the drain being formed in a well;
      a first control element connected to the external node, the first control node, a ground node, and a supply voltage node, the control element placing the signal in the first logic state when a voltage on the external node is less than a supply voltage in combination with a predefined voltage, the control element placing the signal in the second logic state when a voltage on the external node is greater than the supply voltage in combination with the predefined voltage, the first control element including:
         a second transistor having a gate connected to the supply voltage node, a source connected to the external node, and a drain connected to the gate of the first transistor, the source and the drain of the second transistor being formed in the well; and
         a resistive element connected between the gate of the first transistor and a ground node.

10. The driver of claim 9 wherein the over voltage protection circuit further comprises:
    a third transistor having a gate connected to the external node, a source connected to the supply voltage node, and a drain connected to the well, the source and the drain of the third transistor being formed in the well; and
    a fourth transistor having a gate connected to the supply voltage node, a source connected to the external node, and a drain connected to the well, the source and the drain of the fourth transistor being formed in the well.

11. An output driver connectable to an external node, the output driver comprising:
    an over voltage protection circuit connected to an internal node and the external node, the over voltage protection circuit including:
       a pass/isolation element connected to the external node, and the internal node, the pass/isolation element having a first control node, the pass/isolation element passing a voltage on the internal node to the external node when a signal on the first control node is in a first logic state, the pass/isolation element isolating the internal node from the external node when the signal on the first control node is in a second logic state, the pass element including a first transistor having a gate, a source connected to the external node, and a drain connected to the internal node, the source and the drain being formed in a well;

a first control element connected to the external node, the first control node, a ground node, and a supply voltage node, the control element placing the signal in the first logic state when a voltage on the external node is less than a supply voltage in combination with a predefined voltage, the control element placing the signal in the second logic state when a voltage on the external node is greater than the supply voltage in combination with the predefined voltage, the first control element including:

a second transistor having a gate connected to the supply voltage node, a source connected to the external node, and a drain connected to the gate of the first transistor, the source and the drain of the second transistor being formed in the well; and a resistive element connected between the gate of the first transistor and a ground node;

a voltage-setting element connected to the internal node and the supply voltage node, the voltage-setting element having a second control node, the voltage-setting element passing the supply voltage when a signal on the second control node of the voltage-setting element is in a first logic state, the voltage-setting element isolating the supply voltage from the internal node when the signal on the second control node is in a second state; and a second control element connected to the first control node, the second control node, a ground node, and the supply voltage node, the second control element placing the signal on the second control node in the first logic state when a voltage on the external node is greater than the supply voltage in combination with a predefined voltage, the second control element placing the signal on the second control node in the second logic state when a voltage on the external node is less than the supply voltage in combination with the predefined voltage.

12. The driver of claim 11 wherein the over voltage protection circuit further comprises:

a third transistor having a gate connected to the external node, a source connected to the supply voltage node, and a drain connected to the well, the source and the drain of the third transistor being formed in the well; and a fourth transistor having a gate connected to the supply voltage node, a source connected to the external node, and a drain connected to the well, the source and the drain of the fourth transistor being formed in the well.

13. The driver of claim 11 wherein the voltage-setting element includes a fifth transistor having a gate connected to the gate of the first transistor, a source connected to the supply voltage, and a drain; and wherein the second control element includes:

a sixth transistor having a gate connected to the drain of the fifth transistor, a source connected to the supply voltage, and a drain connected to the internal node; and a resistive element connected between the gate of the sixth transistor and a ground node.

14. The driver of claim 6 wherein the over voltage protection circuit further includes a voltage-setting element connected to the external node, the internal node, and the supply voltage node, the voltage-setting element passing the supply voltage.

15. The driver of claim 14 wherein the driver further includes:

a first driver element connected to the internal node, the first driver element having a third control node, and sourcing current to the internal node when a signal on the third control node is in a first logic state, and turning off the first driver element when the signal on the third control node is in a second logic state; and a second driver element connected to the internal node, the second driver element having a fourth control node, and sinking current from the internal node when a signal on the fourth control node is in a second logic state, and turning off the second driver element when the signal on the second control node is in a first logic state.

16. An output driver connectable to an external node, the output driver comprising:

an over voltage protection circuit connected to an internal node and the external node, the over voltage protection circuit including:

a pass/isolation element connected to the external node, and the internal node, the pass/isolation element having a first control node, the pass/isolation element passing a voltage on the internal node to the external node when a signal on the first control node is in a first logic state, the pass/isolation element isolating the internal node from the external node when the signal on the first control node is in a second logic state, the pass element including a first transistor having a gate, a source connected to the external node, and a drain connected to the internal node, the source and the drain being formed in a well;

a first control element connected to the external node, the first control node, a ground node, and a supply voltage node, the control element placing the signal in the first logic state when a voltage on the external node is less than a supply voltage in combination with a predefined voltage, the control element placing the signal in the second logic state when a voltage on the external node is greater than the supply voltage in combination with the predefined voltage, the first control element includes including:

a second transistor having a gate connected to the supply voltage node, a source connected to the external node, and a drain connected to the gate of the first transistor, the source and the drain of the second transistor being formed in the well; and a resistive element connected between the gate of the first transistor and a ground node, and a voltage-setting element connected to the external node, the internal node, and the supply voltage node, the voltage-setting element passing the supply voltage.

17. The driver of claim 16 wherein the over voltage protection circuit further comprises:

a third transistor having a gate connected to the external node, a source connected to the supply voltage node, and a drain connected to the well, the source and the drain of the third transistor being formed in the well; and a fourth transistor having a gate connected to the supply voltage node, a source connected to the external node, and a drain connected to the well, the source and the drain of the fourth transistor being formed in the well.

18. The driver of claim 17 wherein the voltage-setting element includes a fifth transistor having a gate connected to the supply voltage, a source connected to the internal node, and a drain connected to the external node.

* * * * *

UNITED STATES PATENT AND TRADEMARK OFFICE
CERTIFICATE OF CORRECTION

PATENT NO. : 6,724,595 B1
DATED : April 20, 2004
INVENTOR(S) : Kiani

It is certified that error appears in the above-identified patent and that said Letters Patent is hereby corrected as shown below:

<u>Title page,</u>
Item [56], References Cited, insert -- Chen, Deng-Yuan, "Design of a Mixed 3.3V and 5V PCI I/O Buffer", Compass Design Automation. -- and -- Bellaouar Abdellatif et al., "Low-Power Digital VLSI Design Circuits and Systems", Kluwer Academic Publishers, 1995. --

<u>Column 1,</u>
Line 32, delete "arid" and replace with -- and --.

<u>Column 2,</u>
Line 23, delete ",".

<u>Column 9,</u>
Line 13, after "power" insert -- supply voltage, --.

<u>Column 12,</u>
Line 17, delete "OV" and replace with -- 0V --.

<u>Column 20,</u>
Line 40, delete "includes".

Signed and Sealed this

First Day of June, 2004

JON W. DUDAS
*Acting Director of the United States Patent and Trademark Office*